United States Patent
Li et al.

(10) Patent No.: US 9,048,873 B2
(45) Date of Patent: Jun. 2, 2015

(54) SYSTEMS AND METHODS FOR MULTI-STAGE ENCODING OF CONCATENATED LOW DENSITY PARITY CHECK CODES

(71) Applicant: LSI Corporation, San Jose, CA (US)

(72) Inventors: Zongwang Li, San Jose, CA (US); Yu Kou, San Jose, CA (US); Chung-Li Wang, San Jose, CA (US); Shaohua Yang, San Jose, CA (US); Shu Li, Milpitas, CA (US)

(73) Assignee: LSI Corporation, San Jose, CA (US)

( * ) Notice: Subject to any disclaimer, the term of this patent is extended or adjusted under 35 U.S.C. 154(b) by 93 days.

(21) Appl. No.: 13/912,079

(22) Filed: Jun. 6, 2013

(65) Prior Publication Data

US 2014/0281790 A1 Sep. 18, 2014

Related U.S. Application Data

(60) Provisional application No. 61/780,125, filed on Mar. 13, 2013.

(51) Int. Cl.
*H03M 13/00* (2006.01)
*H03M 13/11* (2006.01)

(52) U.S. Cl.
CPC ........ *H03M 13/1171* (2013.01); *H03M 13/611* (2013.01); *H03M 13/616* (2013.01)

(58) Field of Classification Search
CPC .................................................... H03M 13/151
USPC ........................................ 714/785, 755, 800
See application file for complete search history.

(56) References Cited

U.S. PATENT DOCUMENTS

| | | | |
|---|---|---|---|
| 5,278,703 A | 1/1994 | Rub et al. |
| 5,278,846 A | 1/1994 | Okayama |
| 5,317,472 A | 5/1994 | Schweitzer, III |
| 5,325,402 A | 6/1994 | Ushirokawa |
| 5,392,299 A | 2/1995 | Rhines |
| 5,417,500 A | 5/1995 | Martinie |
| 5,513,192 A | 4/1996 | Janku |
| 5,523,903 A | 6/1996 | Hetzler |
| 5,550,810 A | 8/1996 | Monogioudis et al. |
| 5,550,870 A | 8/1996 | Blaker |
| 5,612,964 A | 3/1997 | Haraszti |
| 5,710,784 A | 1/1998 | Kindred |
| 5,717,706 A | 2/1998 | Ikeda |
| 5,802,118 A | 9/1998 | Bliss |
| 5,844,945 A | 12/1998 | Nam |
| 5,898,710 A | 4/1999 | Amrany |
| 5,923,713 A | 7/1999 | Hatakeyama |
| 5,978,414 A | 11/1999 | Nara |

(Continued)

OTHER PUBLICATIONS

Axvig et al., "Average Min-Sum Decoding of LDPC Codes", 5th International Symposium on Turbo Codes and Related Topics (2008).

(Continued)

*Primary Examiner* — Fritz Alphonse
(74) *Attorney, Agent, or Firm* — Hamilton DeSanctis & Cha

(57) ABSTRACT

A data encoding system includes a data encoder circuit operable to encode each of a number of data sectors with a component matrix of a low density parity check code matrix and to yield an output codeword. The data encoder circuit includes a syndrome calculation circuit operable to calculate and combine syndromes for the data sectors.

20 Claims, 5 Drawing Sheets

(56) References Cited

U.S. PATENT DOCUMENTS

| | | | |
|---|---|---|---|
| 5,983,383 | A | 11/1999 | Wolf |
| 6,005,897 | A | 12/1999 | McCallister |
| 6,023,783 | A | 2/2000 | Divsalar |
| 6,029,264 | A | 2/2000 | Kobayashi |
| 6,065,149 | A | 5/2000 | Yamanaka |
| 6,097,764 | A | 8/2000 | McCallister |
| 6,145,110 | A | 11/2000 | Khayrallah |
| 6,216,249 | B1 | 4/2001 | Bliss |
| 6,216,251 | B1 | 4/2001 | McGinn |
| 6,266,795 | B1 | 7/2001 | Wei |
| 6,317,472 | B1 | 11/2001 | Choi |
| 6,351,832 | B1 | 2/2002 | Wei |
| 6,377,610 | B1 | 4/2002 | Hagenauer et al. |
| 6,381,726 | B1 | 4/2002 | Weng |
| 6,473,878 | B1 | 10/2002 | Wei |
| 6,535,553 | B1 | 3/2003 | Limberg et al. |
| 6,625,775 | B1 | 9/2003 | Kim |
| 6,748,034 | B2 | 6/2004 | Hattori |
| 6,757,862 | B1 | 6/2004 | Marianetti, II |
| 6,785,863 | B2 | 8/2004 | Blankenship et al. |
| 6,810,502 | B2 | 10/2004 | Eidson et al. |
| 6,970,511 | B1 | 11/2005 | Barnette |
| 6,986,098 | B2 | 1/2006 | Poeppelman et al. |
| 7,047,474 | B2 | 5/2006 | Rhee et al. |
| 7,058,873 | B2 | 6/2006 | Song et al. |
| 7,073,118 | B2 | 7/2006 | Greenberg et al. |
| 7,093,179 | B2 | 8/2006 | Shea |
| 7,117,427 | B2 | 10/2006 | Ophir |
| 7,133,228 | B2 | 11/2006 | Fung |
| 7,184,486 | B1 | 2/2007 | Wu |
| 7,191,378 | B2 | 3/2007 | Eroz |
| 7,203,887 | B2 | 4/2007 | Eroz |
| 7,308,061 | B1 | 12/2007 | Huang |
| 7,310,768 | B2 | 12/2007 | Eidson |
| 7,313,750 | B1 | 12/2007 | Feng |
| 7,370,258 | B2 | 5/2008 | Iancu |
| 7,415,651 | B2 | 8/2008 | Argon |
| 7,502,189 | B2 | 3/2009 | Sawaguchi |
| 7,523,375 | B2 | 4/2009 | Spencer |
| 7,587,657 | B2 | 9/2009 | Haratsch |
| 7,590,168 | B2 | 9/2009 | Raghavan |
| 7,590,929 | B2 * | 9/2009 | Morita et al. ............... 714/800 |
| 7,646,829 | B2 | 1/2010 | Ashley |
| 7,702,986 | B2 | 4/2010 | Bjerke |
| 7,752,523 | B1 | 7/2010 | Chaichanavong |
| 7,779,325 | B2 | 8/2010 | Song |
| 7,802,172 | B2 | 9/2010 | Casado |
| 7,952,824 | B2 | 5/2011 | Dziak |
| 7,958,425 | B2 | 6/2011 | Chugg |
| 7,996,746 | B2 | 8/2011 | Livshitz |
| 8,018,360 | B2 | 9/2011 | Nayak |
| 8,201,051 | B2 | 6/2012 | Tan |
| 8,237,597 | B2 | 8/2012 | Liu |
| 8,261,171 | B2 | 9/2012 | Annampedu |
| 8,291,284 | B2 | 10/2012 | Savin |
| 8,295,001 | B2 | 10/2012 | Liu |
| 8,316,287 | B1 * | 11/2012 | Varnica et al. ............... 714/801 |
| 8,448,050 | B2 * | 5/2013 | Sakaue et al. ............... 714/785 |
| 2008/0069373 | A1 | 3/2008 | Jiang |
| 2008/0304558 | A1 | 12/2008 | Zhu et al. |
| 2009/0132893 | A1 | 5/2009 | Miyazaki |
| 2009/0185643 | A1 | 7/2009 | Fitzpatrick |
| 2011/0167227 | A1 | 7/2011 | Yang |
| 2011/0264987 | A1 | 10/2011 | Li |
| 2012/0124118 | A1 | 5/2012 | Ivkovic |
| 2012/0182643 | A1 | 7/2012 | Zhang |
| 2012/0207201 | A1 | 8/2012 | Xia |
| 2012/0212849 | A1 | 8/2012 | Xu |
| 2012/0262814 | A1 | 10/2012 | Li |
| 2012/0265488 | A1 | 10/2012 | Sun |

OTHER PUBLICATIONS

Bahl et al., "Optimal decoding of linear codes for minimizing symbol error rate", IEEE Trans. Inform. Theory, vol. 20, pp. 284-287 (Mar. 1974).

Blaum, "High-Rate Modulation Codes for Reverse Concatenation", IEEE Transactions on Magnetics, vol. 43, No. 2 (Feb. 2007).

Casado et al., Multiple-rate low-density parity-check codes with constant blocklength, IEEE Transations on communications, Jan. 2009, vol. 57, pp. 75-83.

Cui et al., "High-Throughput Layered LDPC Decoding Architecture", IEEE Transactions on Very Large Scale Integration (VLSI) Systems, vol. 17, No. 4 (Apr. 2009).

Fair et al., "Guided scrambling: a new line coding technique for high bit rate fiber optic transmission systems", IEEE Trans. Commun., vol. 39, pp. 289-297 (Feb. 1991).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Jin et al., "Design Techniques for Weakly Constrained Codes", IEEE Trans Commun. vol. 51, No. 5, pp. 709-714 (May 2003).

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Shokrollahi "LDPC Codes: An Introduction", Digital Fountain, Inc. (Apr. 2, 2003).

Spagnol et al, "Hardware Implementation of GF(2m) LDPC Decoders", IEEE Transactions on Circuits and Systemssi: Regular Papers, vol. 56, No. 12 (Dec. 2009).

Tehrani et al., "Fully Parallel Stochastic LDPC Decoders", IEEE Transactions on Signal Processing, vol. 56, No. 11 (Nov. 2008).

Todd et al., "Enforcing maximum-transition-run code constraints and low-density parity check decoding", IEEE Trans. Magn., vol. 40, No. 6, pp. 3566-3571 (Nov. 2004).

U.S. Appl. No. 13/296,022, filed Nov. 14, 2011, Victor Krachkovsky, Unpublished.

U.S. Appl. No. 13/269,852, filed Oct. 10, 2011, Haitao Xia, Unpublished.

U.S. Appl. No. 13/898,685, filed May 21, 2013, Dan Liu, Unpublished.

(56) References Cited

OTHER PUBLICATIONS

U.S. Appl. No. 13/284,767, filed Oct. 28, 2011, Fan Zhang, Unpublished.
U.S. Appl. No. 13/227,544, filed Sep. 8, 2011, Shaohua Yang, Unpublished.
U.S. Appl. No. 13/239,683, filed Sep. 22, 2011, Changyou Xu, Unpublished.
U.S. Appl. No. 13/186,234, filed Jul. 19, 2011, Haitao Xia, Unpublished.
U.S. Appl. No. 13/213,751, filed Aug. 19, 2011, Fan Zhang, Unpublished.
U.S. Appl. No. 13/227,416, filed Sep. 7, 2011, Lei Chen, Unpublished.
U.S. Appl. No. 13/174,537, filed Jun. 30, 2011, Anantha Raman Krishnan, Unpublished.
U.S. Appl. No. 13/180,495, filed Jul. 11, 2011, Chung-Li Wang, Unpublished.
U.S. Appl. No. 13/174,453, filed Jun. 30, 2011, Johnson Yen, Unpublished.
U.S. Appl. No. 13/171,615, filed Jun. 29, 2011, Bradley D. Seago, Unpublished.
U.S. Appl. No. 13/113,219, filed May 23, 2011, Yang Han, Unpublished.
U.S. Appl. No. 13/284,730, filed Oct. 28, 2011, Fan Zhang, Unpublished.
U.S. Appl. No. 13/305,551, filed Nov. 28, 2011, Yang Han, Unpublished.
U.S. Appl. No. 13/283,549, filed Oct. 27, 2011, Wu Chang, Unpublished.
U.S. Appl. No. 13/777,841, filed Feb. 26, 2013, Shu Li, Unpublished.
U.S. Appl. No. 13/596,819, filed Aug. 28, 2012, Shaohua Yang, Unpublished.
U.S. Appl. No. 13/596,947, filed Aug. 28, 2012, Fan Zhang, Unpublished.
U.S. Appl. No. 13/302,119, filed Nov. 22, 2011, Lei Chen, Unpublished.
U.S. Appl. No. 13/597,001, filed Aug. 28, 2012, Fan Zhang, Unpublished.
U.S. Appl. No. 13/269,832, filed Oct. 10, 2011, Haitao Xia, Unpublished.
U.S. Appl. No. 13/621,341, filed Sep. 17, 2012, Shaohua Yang, Unpublished.
U.S. Appl. No. 13/597,026, filed Aug. 28, 2012, Fan Zhang, Unpublished.
U.S. Appl. No. 13/989,583, filed Oct. 15, 2012, Shaohua Yang, Unpublished.
U.S. Appl. No. 13/545,833, filed Jul. 10, 2012, Zhi Bin Li, Unpublished.
U.S. Appl. No. 13/670,393, filed Nov. 6, 2012, Lei Chen, Unpublished.
U.S. Appl. No. 13/596,978, filed Aug. 28, 2012, Fan Fan Zhang, Unpublished.
U.S. Appl. No. 13/777,976, filed Feb. 26, 2013, Shu Li, Unpublished.
U.S. Appl. No. 13/777,381, filed Feb. 26, 2013, Shaohua Yang, Unpublished.
U.S. Appl. No. 13/741,003, filed Jan. 14, 2013, Lu Lu, Unpublished.
U.S. Appl. No. 13/873,224, filed Apr. 30, 2013, Razmik Karabed, Unpublished.
U.S. Appl. No. 13/875,951, filed May 2, 2013, Mikhail I Grinchuk, Unpublished.
U.S. Appl. No. 13/742,336, filed Jan. 15, 2013, Jianzhong Huang, Unpublished.
U.S. Appl. No. 13/742,340, filed Jan. 15, 2013, Razmik Karabed, Unpublished.
U.S. Appl. No. 13/886,103, filed May 2, 2013, Chung-Li Wang, Unpublished.
U.S. Appl. No. 13/622,294, filed Sep. 18, 2012, Fan Zhang, Unpublished.
U.S. Appl. No. 13/369,468, filed Feb. 9, 2012, Zongwang Li, Unpublished.
U.S. Appl. No. 13/445,848, filed Apr. 12, 2012, Bruce Wilson, Unpublished.
U.S. Appl. No. 13/412,520, filed Mar. 5, 2012, Fan Zhang, Unpublished.
U.S. Appl. No. 13/426,714, filed Mar. 22, 2012, Shaohua Yang, Unpublished.
U.S. Appl. No. 13/619,907, filed Sep. 14, 2012, Fan Zhang, Unpublished.
U.S. Appl. No. 13/316,858, filed Dec. 12, 2011, Zongwang Li, Unpublished.
U.S. Appl. No. 13/445,834, filed Apr. 12, 2012, Chung-Li Wang, Unpublished.
U.S. Appl. No. 13/316,741, filed Dec. 12, 2011, Yang Han, Unpublished.
U.S. Appl. No. 13/327,279, filed Dec. 15, 2011, Wei Feng, Unpublished.
U.S. Appl. No. 13/362,409, filed Jan. 31, 2012, Fan Zhang, Unpublished.
U.S. Appl. No. 13/340,951, filed Dec. 30, 2011, Lei Chen, Unpublished.
U.S. Appl. No. 13/372,580, filed Feb. 14, 2012, Fan Zhang, Unpublished.
U.S. Appl. No. 13/305,510, filed Nov. 28, 2011, Lei Chen, Unpublished.
U.S. Appl. No. 13/295,150, filed Nov. 14, 2011, Zongwang Li, Unpublished.
U.S. Appl. No. 13/422,986, filed Mar. 16, 2012, Fan Zhang, Unpublished.
U.S. Appl. No. 13/433,693, filed Mar. 29, 2012, Fan Zhang, Unpublished.
U.S. Appl. No. 13/445,878, filed Apr. 12, 2012, Yu Liao, Unpublished.
U.S. Appl. No. 13/474,660, filed May 17, 2012, Zongwang Li, Unpublished.
U.S. Appl. No. 13/363,751, filed Feb. 1, 2012, Lei Chen, Unpublished.
U.S. Appl. No. 13/300,078, filed Nov. 18, 2011, Chung-Li Wang, Unpublished.
U.S. Appl. No. 13/340,974, filed Dec. 30, 2011, Dan Liu, Unpublished.
Vasic, B., "High-Rate Girth-Eight Codes on Rectangular Integer Lattices", IEEE Trans. Communications, vol. 52, Aug. 2004, pp. 1248-1252.
Vasic, B., "High-Rate Low-Density Parity-Check Codes Based on Anti-Pasch Affine Geometries," Proc ICC 2002, pp. 1332-1336.
Weon-Cheol Lee et al., "Vitierbi Decoding Method Using Channel State Info. In COFDM System" IEEE Trans. on Consumer Elect., IEEE Service Center, NY, NY vol. 45, No. 3 Aug. 1999.
Yeo et al., "VLSI Architecture for Iterative Decoders in Magnetic Storage Channels", Mar. 2001, pp. 748-755, IEEE trans. Magnetics, vol. 37, No. 2.
Zhang et al., "Analysis of Verification-Based Decoding on the q-ary Symmetric Channel for Large q", IEEE Trans. on Information Theory, vol. 57, No. 10 (Oct. 2011).
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.
Zhong et al., "Joint Code-Encoder Design for LDPC Coding System VLSI Implementation", ISCAS, IEEE pp. 389-392, May 2004.
Zhong et al., "Quasi Cyclic LDPC Codes for the Magnetic Recording Channel: Code Design and VSLI Implementation", IEEE Transactions on Magnetics, v. 43, pp. 1118-1123, Mar. 7.
Zhong, "Block-LDPC: A Practical LDPC Coding System Design Approach", IEEE Trans. on Circuits, Regular Papers, vol. 5, No. 4, pp. 766-775, Apr. 2005.

\* cited by examiner

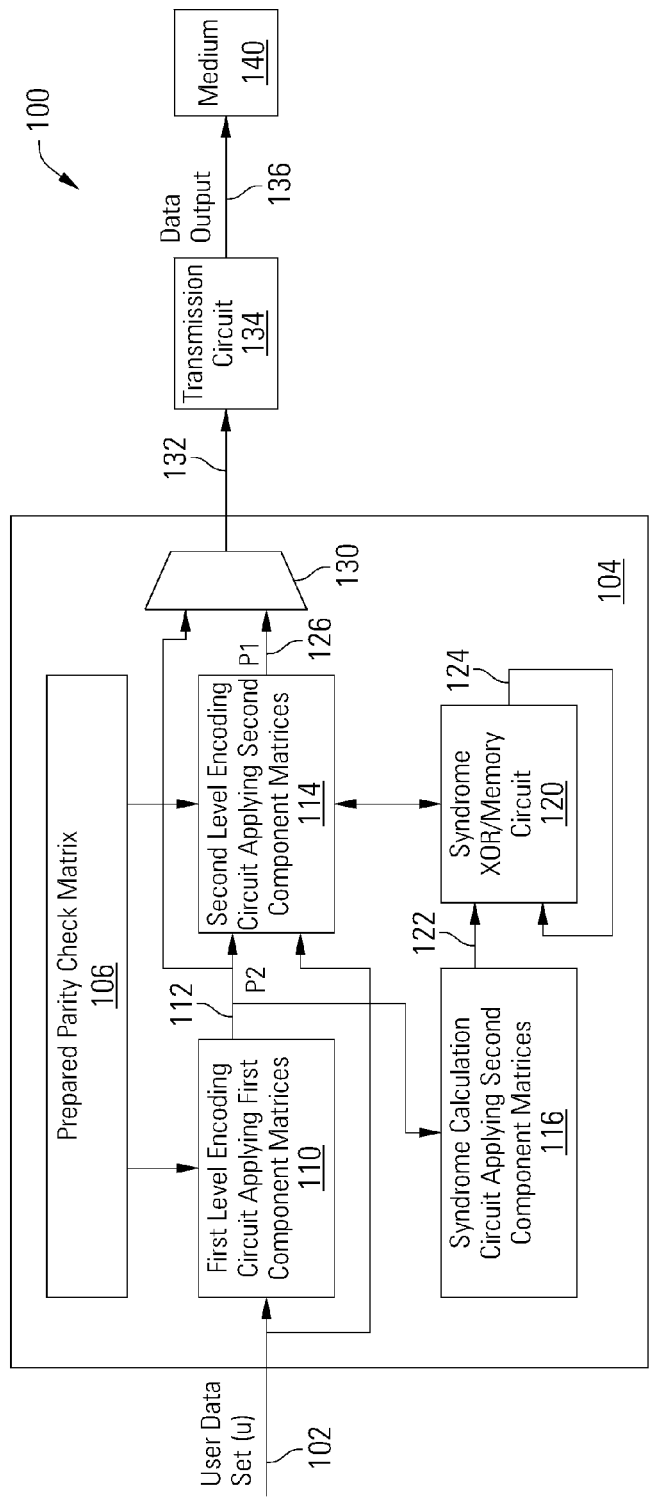

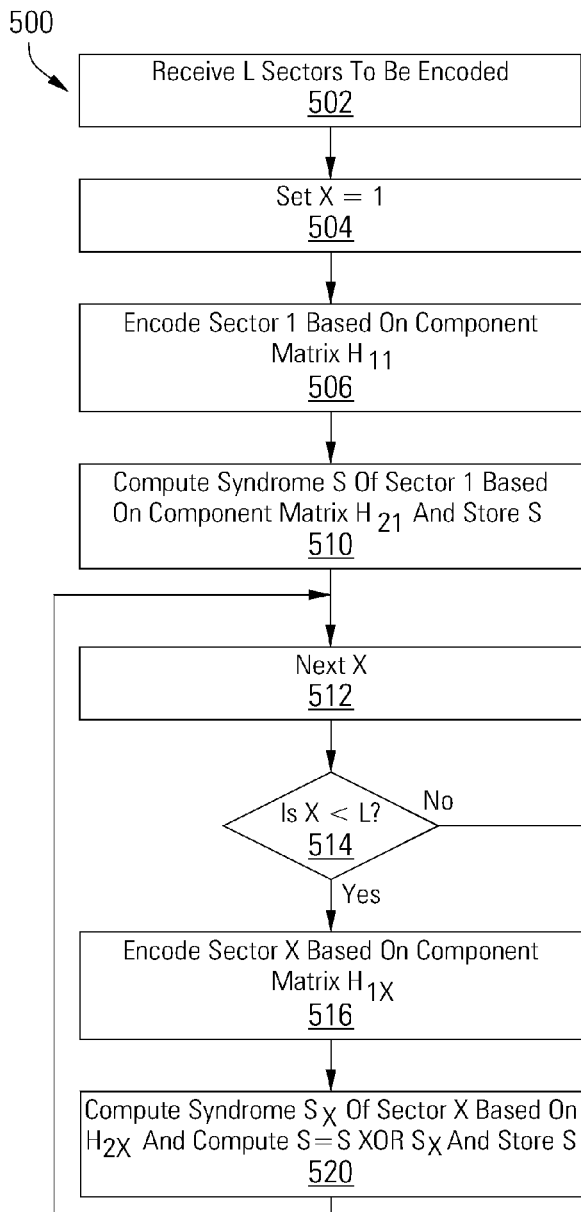
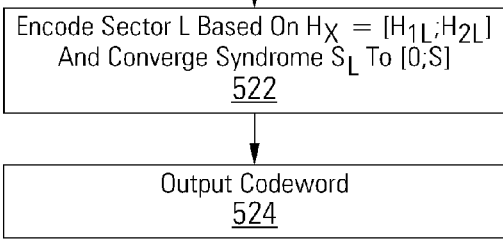
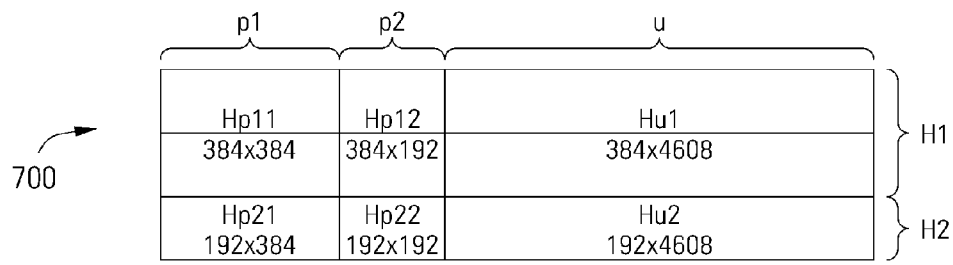

SYSTEMS AND METHODS FOR MULTI-STAGE ENCODING OF CONCATENATED LOW DENSITY PARITY CHECK CODES

CROSS REFERENCE TO RELATED APPLICATIONS

The present application claims priority to (is a non-provisional of) U.S. Pat. App. No. 61/780,125, entitled "Systems and Methods for Multi-Stage Encoding Of Concatenated Low Density Parity Check Codes", and filed Mar. 13, 2013 by Li et al, the entirety of which is incorporated herein by reference for all purposes.

FIELD OF THE INVENTION

Various embodiments of the present invention provide systems and methods for data processing, and more particularly to systems and methods for multi-stage encoding for concatenated low density parity check codes.

BACKGROUND

Various data processing systems have been developed including storage systems, cellular telephone systems, and radio transmission systems. In such systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. The effectiveness of any transfer is impacted by any losses in data caused by various factors. Many types of error checking systems have been developed to detect and correct errors in digital data. For example, in perhaps the simplest system, a parity bit can be added to a group of data bits, ensuring that the group of data bits (including the parity bit) has either an even or odd number of ones. The parity bits may also be used in error correction systems, including in low density parity check (LDPC) encoding and decoding circuits. In some cases, the data decoding circuit operates on a very large codeword that includes a number of parity bits to decode relatively large encoded data sectors. Traditional low density parity check encoders and decoders for relatively large sectors require large memory sizes and long latency.

SUMMARY

Various embodiments of the present invention provide systems and methods for data processing, and more particularly to systems and methods for multi-stage encoding for concatenated low density parity check codes.

A data encoding system is disclosed including a data encoder circuit operable to encode each of a number of data sectors with a component matrix of a low density parity check code matrix and to yield an output codeword. The data encoder circuit includes a syndrome calculation circuit operable to calculate and combine syndromes for the data sectors.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phrases do not necessarily refer to the same embodiment. This summary provides only a general outline of some embodiments of the invention. Additional embodiments are disclosed in the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals may be used throughout several drawings to refer to similar components. In the figures, like reference numerals are used throughout several figures to refer to similar components.

FIG. 1 shows a multi-stage data encoding circuit for concatenated low density parity check codes in accordance with one or more embodiments of the present invention;

FIG. 2 shows a parity check matrix made up of component matrices to be applied by an encoder circuit to perform an encoding operation according to one or more embodiments of the present invention;

FIG. 3 shows the component matrix structure for a low density parity check code in accordance with one or more embodiments of the present invention;

FIG. 4 is a circulant in the component matrix for a low density parity check code in accordance with one or more embodiments of the present invention;

FIG. 5 is a flow diagram showing a method in accordance with some embodiments of the present invention for multi-stage encoding of concatenated low density parity check codes;

FIG. 6 shows a low density parity check encoded output including multiple portions in accordance with one or more embodiments of the present invention;

FIG. 7 depicts a parity check matrix with multiple portions that are used in different portions of the decoding circuitry in the multi-stage encoding circuit of FIG. 1 in accordance with one or more embodiments of the present invention;

DETAILED DESCRIPTION OF THE INVENTION

Figure 8:
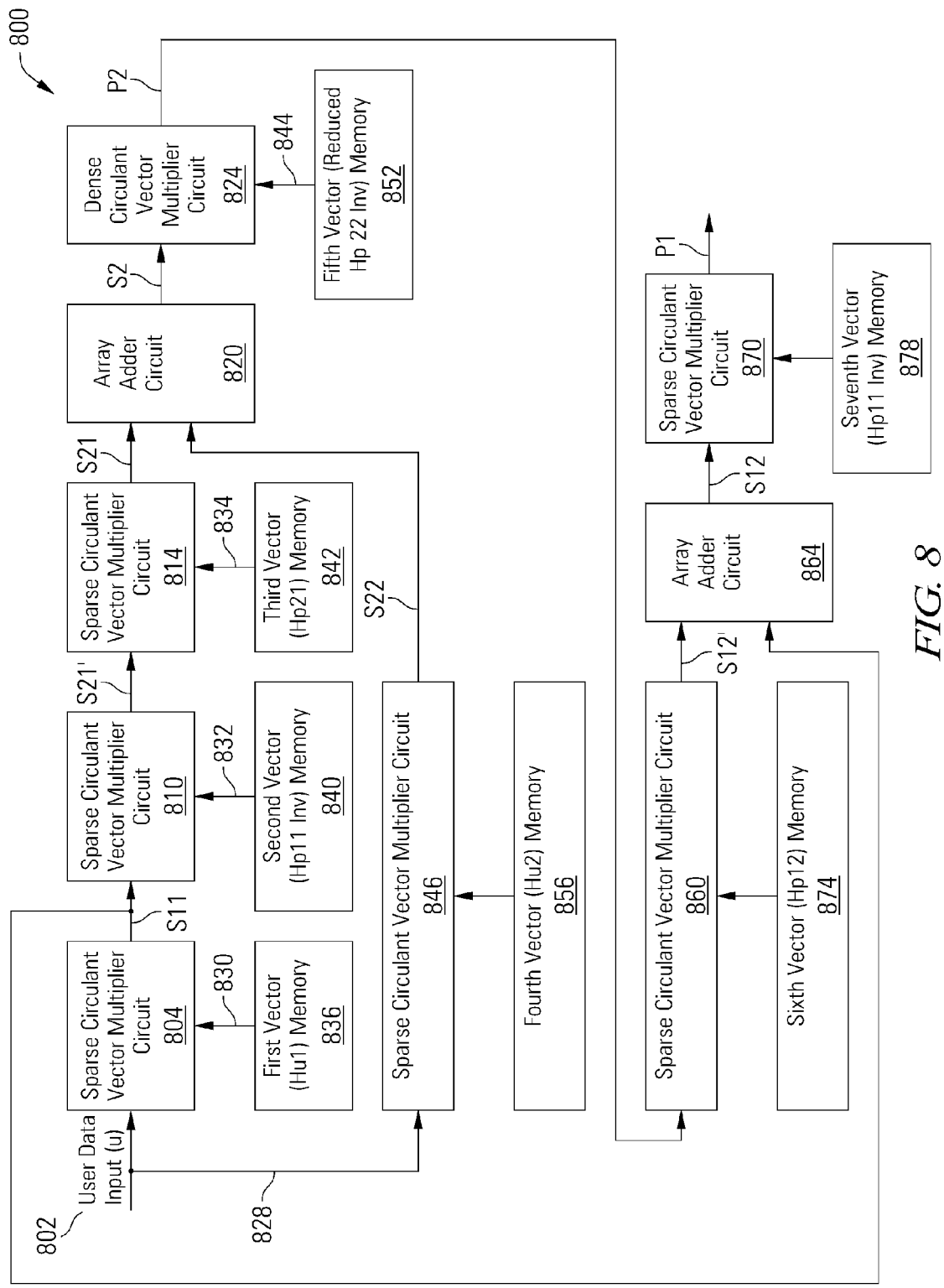
FIG. 8 shows an implementation of a multi-stage encoding circuit in accordance with one or more embodiments of the present invention.

Various embodiments of the present invention provide systems and methods for multi-stage data encoding for concatenated low density parity check codes. Multi-stage encoding reduces latency and can use relatively small memories when encoding large data sectors. A large data sector can be divided into a number of smaller sectors or subsectors, each of which is encoded in a multi-stage low density parity check encoding process to yield a codeword for the large data sector. The systems and methods for multi-stage data encoding for concatenated low density parity check codes may be applied to binary and non-binary encoding using any suitable encoding algorithm, such as a low density parity check algorithm of any variety. The term "data sector" is used herein to refer to a block of data to be encoded. In some embodiments, a data sector comprises a sector to be written to a magnetic hard disk, although the term "data sector" is not limited to this application or structure.

Turning to FIG. 1, a data encoding circuit 100 is shown that includes multi-stage non-binary encoding in accordance with one or more embodiments of the present invention. Data encoding circuit 100 includes an encoder circuit 104 and a transmission circuit 134. Encoder circuit 104 includes a prepared parity check matrix 106 that includes a parity check matrix divided into component matrices or sub-matrices used in relation to data encoding. Encoder circuit 104 also includes a first level encoding circuit 110 and a second level encoding circuit 114. Data encoding circuit 100 is able to apply encode data in the first level encoding circuit 110 and a second level encoding circuit 114 and to calculate syndrome values based on component matrices in the prepared parity check matrix 106. As will be disclosed in more detail below, the component matrices in the prepared parity check matrix 106 are categorized in two groups in one embodiment of the invention, with the first level encoding circuit 110 applying the first group of component matrices in the encoding process and the second level encoding circuit 114 applying the second group of component matrices in the encoding process. In some embodiments, the prepared parity check matrix 106 includes one component matrix per column from each of the two groups.

First level encoding circuit 110 applies a data encoding algorithm to a user data input (u) 102 using component matrices from the first group to yield a first level encoded output (p2) 112. A syndrome calculation circuit 116 calculates a syndrome for the data sector just encoded by the first level encoding circuit 110, using the component matrix from the second group, and the syndrome 122 is stored in a syndrome XOR/memory circuit 120. The first level encoding circuit 110 thus encodes a data sector using a component matrix from the first group and the syndrome calculation circuit 116 calculates a syndrome for that data sector using the component matrix from the second group in the same H matrix column as the component matrix from the first group used by the first level encoding circuit 110. The process is repeated column by column across the prepared parity check matrix 106, encoding data sectors using the first group component matrix in the first level encoding circuit 110 and calculating syndromes for the same syndrome using the second group component matrix in the syndrome calculation circuit 116. In some embodiments, the data sectors encoded with each column of the prepared parity check matrix 106 are each portions of a single large data sector to be encoded. As each successive syndrome is calculated in the syndrome calculation circuit 116, it is combined with the previous syndromes in an XOR operation performed by the syndrome XOR/memory circuit 120 with the result stored in the syndrome XOR/memory circuit 120. When the final column of the prepared parity check matrix 106 is reached, the last data sector is encoded in a multi-stage encoding operation using both the first level encoding circuit 110 and second level encoding circuit 114 to encode the data sector using both the first group and second group component matrices in the final column, with the final syndrome from the syndrome XOR/memory circuit 120 converging to the non-zero value [0;S] to yield output codeword or second level encoded output (p1) 126.

During this final column encoding operation, in order to encode using both the first group and second group component matrices, the data sector is encoded using the first group component matrix in the first level encoding circuit 110, and the resulting first level encoded output (p2) 112 is provided to the second level encoding circuit 114 applying the second group component matrix to yield the second level encoded output (p1) 126 or output codeword.

A selector or switch 130 selects either the first level encoded output (p2) 112 or the second level encoded output (p1) 126 at various stages of the encoding process to form the output codeword 132. The switch 130 selects the first level encoded output (p2) 112 from the first level encoding circuit 110 as each sector is encoded using each column of the prepared parity check matrix 106 but the final, and selects the second level encoded output (p1) 126 as the last sector is encoded using the final column of the prepared parity check matrix 106. The output codeword 132 thus includes encoded data (or parity bits to be added to the corresponding data sectors in user data set 102) that has been encoded using the first group component matrices for all but the final sector, and encoded data that has been encoded using both the first and second group component matrices in a multi-stage encoding operation for the final sector.

Output codeword 132 is provided to a medium 140. Medium 140 may be, but is not limited to, a magnetic storage medium, a wireless transmission medium, a wired transmission medium, an optical transmission medium, or the like. Based upon the disclosure provided herein, one of ordinary skill in the art will recognize a variety of medium and combinations of mediums that may be used in relation to different embodiments of the present invention.

Turning to FIG. 2, the prepared parity check matrix H 200 applied by the encoder circuit 104 to perform an encoding operation is shown according to one or more embodiments of the present invention. The parity check matrix 200 is divided into a number of component matrices, which in some embodiments are quasi-cycle low density parity check codes. The component matrices are generally divided into two groups, a first component matrix group 204 and a second component matrix group 204. In some embodiments, the first component matrix group 202 is made up of a common or same matrix, and the second component matrix group 204 is made up of another common or same matrix. Each row of the parity check matrix 200 but one includes one component matrix from the first component matrix group 202, with the remaining row including component matrices from the second component matrix group 204. Each column of the parity check matrix 200 includes one component matrix from the first component matrix group 202 and one component matrix from the second component matrix group 204. The organization or distribution of component matrices from the first component matrix group 202 in the parity check matrix 200 is not limited to the diagonal disclosed in FIG. 2. The component matrices from the first component matrix group 202 are denoted in FIG. 2 as $H_{1L}$, where L represents the column number, and the component matrices from the second component matrix group 204 are denoted as $H_{2L}$, where L represents the column number.

A component matrix from parity check matrix 200 is applied to a data sector in an encoder circuit 104 to yield a codeword C, and a syndrome S is calculated for the codeword C by taking the dot product of the codeword C vector with a component matrix H (e.g., $H_{13}$), or $S=C \cdot H_{13}$. The syndromes or syndrome vectors calculated using the component matrices from the first component matrix group 202 converge in a decoder to 0 to indicate correct data values, and converge to non-zero values to indicate the presence of errors. However, syndromes calculated using the component matrices from the second component matrix group 204 converge in a decoder to non-zero values even when no errors exist.

During operation, a large sector is divided into a number of smaller sectors, each to be encoded using a component matrix from the first component matrix group 202 from a different column in the parity check matrix 200 corresponding to the smaller sector being encoded. The last smaller sector, encoded during the final column of the parity check matrix 200 (which may be but is not necessarily the right-most column), is encoded differently, using both the component matrix from the first component matrix group 202 and the component matrix from the second component matrix group 204, or $H_L=[H1_L;H2_L]$ in a multi-stage encoding process.

Although syndromes for codewords generated using an encoding process based only on a component matrix from the first component matrix group 202 converge to 0 in the absence of errors, the syndrome for the multi-stage encoding process disclosed herein is based on the XOR of all the non-zero syndromes for each column, generated by taking the dot product of the codeword C vector with the corresponding component matrix from the second component matrix group 204. In other words, the first component matrix group 202 is used for encoding in all columns but the final, and the second component matrix group 204 is used for calculating non-zero syndromes. In the final column, both the first component matrix group 202 and second component matrix group 204 are used for encoding using a multi-stage encoding process, with the syndrome for the final column converging to [0;S], where S is the XOR of each syndrome calculated for all other columns in the parity check matrix 200, using the component matrix from the second component matrix group 204. The resulting syndrome for the overall encoded large sector based on the parity check matrix 200 will converge to 0 in the absence of errors. The total overall codeword for the large sector includes the codewords generated by the encoding process for the small sectors using one column of the parity check matrix 200 for each.

Turning to FIG. 3, the component matrix structure $H_{i,j}$ 300 is shown for a low density parity check code in accordance with one or more embodiments of the present invention. Each circulant $P_{i,j}$ in the component matrix 300 represents a connection between a variable node and a check node in some low density parity check embodiments, with the placement of the circulants $P_{i,j}$ in the component matrix $H_{i,j}$ 300 designed to provide desired error detection and correction performance with a relatively small number of parity bits. Each circulant $P_{i,j}$ 400 is a pxp circulant with weight 1, a permutation of the identity matrix, as shown in FIG. 4, where elements a in the circulant $P_{i,j}$ 400 are elements over Galois Field $GF(2^q)$. For a binary low density parity check code, q=1 and a is either 0 or 1. For a non-binary low density parity check code, q>1 and a is a random non-zero element a(i,j) from the Galois Field that provides a permutation for messages between the variable node and check node identified by the placement of the element a(i,j) in the circulant $P_{i,j}$ 400.

Turning to FIG. 5, a flow diagram 500 discloses a method in accordance with some embodiments of the present invention for multi-stage encoding of concatenated low density parity check codes. The method includes receiving L sectors to be encoded, or dividing a received sector into L smaller sectors for encoding (block 502). A variable X is used in some embodiments to track and control the encoding of each of the L sectors. The variable X is initialized to 1 (block 504) at the start of the encoding process to begin with one of the L sectors. In various embodiments, the order of encoding of the L sectors may be different, and may be encoded column by column using an H matrix or in other orders. The first sector is encoded based on component matrix $H_{11}$, a component matrix in the first group (block 506). The syndrome S of the first sector is computed based on component matrix $H_{21}$ and is stored (block 510). Again, component matrix $H_{21}$ is a component matrix in the second group, which results in non-zero syndromes for error-free data. The variable X is incremented to move to encoding of the next sector (block 512). A determination is made as to whether the process has reached the last of the L sectors (block 514). If not, the process continues by encoding sector X based on component matrix $H_{1X}$, another component matrix in the first group (block 516). The syndrome $S_X$ of sector X is computed based on component matrix $H_{2X}$ and the stored syndrome S is updated as S=S XOR $S_X$ (block 520). Processing continues at block 512 by incrementing X (block 512).

Once the process has reached the last of the L sectors (block 514), the last sector L is encoded based on a component matrix $H_X=[H_{1L};H_{2L}]$, with the syndrome $S_L$ for the last column converging to [0;S] (block 522). The overall syndrome converges to 0 for error-free data. The codeword for the L sectors is then output (block 524) to be stored or transmitted.

The encoding of the last sector is performed using the same encoding algorithm as the other sectors, although it is encoded using component matrices from both groups, e.g., using component matrix $H_X=[H_{1L};H_{2L}]$, which is a column-wise overlapping of two component matrices. The encoding using component matrix $H_X=[H_{1L};H_{2L}]$ may be performed in any suitable manner, such as but not limited to that disclosed in FIGS. 6-9.

Turning to FIG. 6, an example low density parity check encoded output 600 corresponding to second level encoded output (p1) 126 and including an H1 portion and an H2 portion is shown. Although two rows are included in the example H2 portion of low density parity check encoded output 600, in some embodiments only include one row in the H2 portion. Each of $P_{i,j}$ are circulants similar to that discussed above in relation to FIG. 3 above. Turning to FIG. 7, an example parity check matrix 700 similar to that programmed as prepared parity check matrix 106 is shown. Portions of parity check matrix 700 (i.e., Hp11, Hp12, Hu1, Hp21, Hp22 and Hu2) are used in relation to different portions of the decoding circuitry implemented as first level encoding circuit 110 and second level encoding circuit 114. As discussed below in relation to FIG. 8, some embodiments use matrix portions derived from the portions shown in example parity check matrix 700.

In operation, data encoding circuit 104 applies a first level encoding algorithm to user data input (u) 102. This encoding algorithm includes parity information with user data input (u) 102 such that the following equation is made true:

$$H1 \times C = H1 \times \begin{bmatrix} p1 \\ p2 \\ u \end{bmatrix} \equiv 0,$$

where $H1 = [\ Hp11 \quad Hp12 \quad Hu1\ ]$.

The second level encoding algorithm is applied to user data input (u) 102. This encoding algorithm includes parity information with user data input (u) 102 such that the following equation is made true:

$$H2 \times C = H2 \times \begin{bmatrix} p1 \\ p2 \\ u \end{bmatrix} \equiv 0,$$

where $$H2 = [\, Hp21 \quad Hp22 \quad Hu2\,].$$

In one embodiment of the present invention, Hp11 is a 4×4 circulant with full rank and the inversion of Hp11 (i.e., Hp11 Inv) is a sparse circulant matrix.

Rearranging the combination of the H1 and H2 portions of the above mentioned equations yields the following:

$$(-Hp21 \times Hp11\mathrm{Inv} \times H1 \times C) + (H2 \times C) \equiv 0;$$

$$[0(-Hp21 \times Hp11\mathrm{Inv} \times Hp12 + Hp22)(-Hp21 \times Hp11\mathrm{Inv} \times Hu1 + Hu2)] \times C \equiv 0; \text{ and}$$

$$[0(Hp22)(-Hp21 \times Hp11\mathrm{Inv} \times Hu1 + Hu2)] \times C \equiv 0.$$

In some embodiments of the present invention, $\tilde{H}p22$ is a 192×192 sparse matrix. The resulting equation from above can be further expanded as follows:

$$[\,0 \quad (\tilde{H}p22) \quad (-Hp21 \times Hp11\ \mathrm{Inv} \times Hu1 + Hu2)\,] \times \begin{bmatrix} p1 \\ p2 \\ u \end{bmatrix} \equiv 0;,$$

where $$\tilde{H}u2 = -Hp21 \times Hp11\mathrm{Inv} \times Hu1 + Hu2.$$

In some embodiments of the present invention, Hp21, Hp11 Inv, Hu1, and Hu2 are all sparse circulant matrices. If $\tilde{H}p22$ is not a full rank matrix, the full rank base matrix $\tilde{H}p22$ which has the same rank as $\tilde{H}p22$ is found in accordance with the above mentioned equation.

In some embodiments of the present invention, the inverse of $\tilde{H}p22$ (i.e., $\tilde{H}p22$ Inv) may be used to implement encoder circuit 104. Turning to FIG. 8, an implementation of a multi-stage non-binary encoding circuit 800 using inverse matrices is shown in accordance with one or more embodiments of the present invention. Multi-stage non-binary encoding circuit 800 may be used in place of encoder circuit 104 of FIG. 1. Multi-stage non-binary encoding circuit 300 includes a sparse circulant vector multiplier circuit 804 that multiplies a user data input (u) 802 by an Hu1 parity matrix portion maintained in a first vector memory 836 to yield an interim output S11 in accordance with the following equation:

$$S11 = Hu1 \times u.$$

Hu1 is a sparse matrix in circulant form. In turn, S11 is provided to a sparse circulant vector multiplier circuit 810 that multiplies it by an inverse of an Hp11 parity matrix portion (Hp11 Inv) maintained in a second vector memory 840 to yield an interim output S21' in accordance with the following equation:

$$S21' = Hp11\mathrm{Inv} \times Hu1 \times u.$$

Hp11 Inv is a sparse matrix in circulant form. In turn, S21' is provided to a sparse circulant vector multiplier circuit 814 that multiplies it by the negative of an Hp21 parity matrix portion (−Hp21) maintained in a third vector memory 842 to yield an interim output S21 in accordance with the following equation:

$$S21 = -Hp21 \times Hp11\mathrm{Inv} \times Hu1 \times u.$$

−Hp21 is a sparse matrix in circulant form.

In parallel, user data input (u) 202 is provided to a sparse circulant vector multiplier circuit 846 that multiplies it by an Hu2 parity matrix portion maintained in a fourth vector memory 856 to yield an interim output S22 in accordance with the following equation:

$$S22 = Hu2 \times u.$$

The interim outputs S21 and S22 are provided to an array adder circuit 820 that sums the received vectors to yield another interim output S2 in accordance with the following equation:

$$S2 = (-Hp21 \times Hp11\mathrm{Inv} \times Hu1 \times u) + (Hu2 \times u).$$

Interim output S2 is provided to a dense circulant multiplier circuit 824 that multiplies S2 by an inverse of an $\tilde{H}p22$ parity matrix portion ($\tilde{H}p22$ Inv) maintained in a fifth vector memory 852 to yield an interim output p2 in accordance with the following equation:

$$P2 = \tilde{H}p22\mathrm{Inv} \times [(-Hp21 \times Hp11\mathrm{Inv} \times Hu1 \times u) + (Hu2 \times u)] = -S2.$$

In one particular embodiment of the present invention, $\tilde{H}p22$ Inv is a dense circulant matrix having a reduced size compared with Hp22. For example, where Hp22 is a 192×192 matrix, $\tilde{H}p22$ Inv may be a 96×96 matrix.

Interim output P2 is provided to a sparse circulant vector multiplier circuit 860 that multiplies it by an Hp12 parity matrix portion maintained in a sixth vector memory 874 to yield an interim output S12' in accordance with the following equation:

$$S12' = (Hp12) \times \tilde{H}p22\mathrm{Inv} \times [(-Hp21 \times Hp11\mathrm{Inv} \times Hu1 \times u) + (Hu2 \times u)].$$

Interim output S12' is an array adder circuit 864 that sums the received vectors to yield another interim output S12 in accordance with the following equation:

$$S12 = (Hp12) \times \tilde{H}p22\mathrm{Inv} \times [(-Hp21 \times Hp11\mathrm{Inv} \times Hu1 \times u) + (Hu2 \times u)] + u.$$

Interim output S12 is then provided to a sparse circulant vector multiplier circuit 870 that multiplies it by an Hp11 Inv parity matrix portion maintained in a seventh vector memory 878 to yield an encoded output P1 in accordance with the following equation:

$$P1 = Hp11\mathrm{Inv} \times [(Hp12) \times \tilde{H}p22\mathrm{Inv} \times [(-Hp21 \times Hp11\mathrm{Inv} \times Hu1 \times u) + (Hu2 \times u)] + u],$$

Which satisfies the equation:

$$[(\tilde{H}p22)\ (\tilde{H}u2)] \times \begin{bmatrix} p2 \\ u \end{bmatrix} \equiv 0,$$

where $$\tilde{H}u2 = -Hp21 \times Hp11\ \mathrm{Inv} \times Hu1 + Hu2.$$

Accordingly, the implementation of multi-stage non-binary encoding circuit 800 yields the same output as encoder circuit 104.

Figure 9:
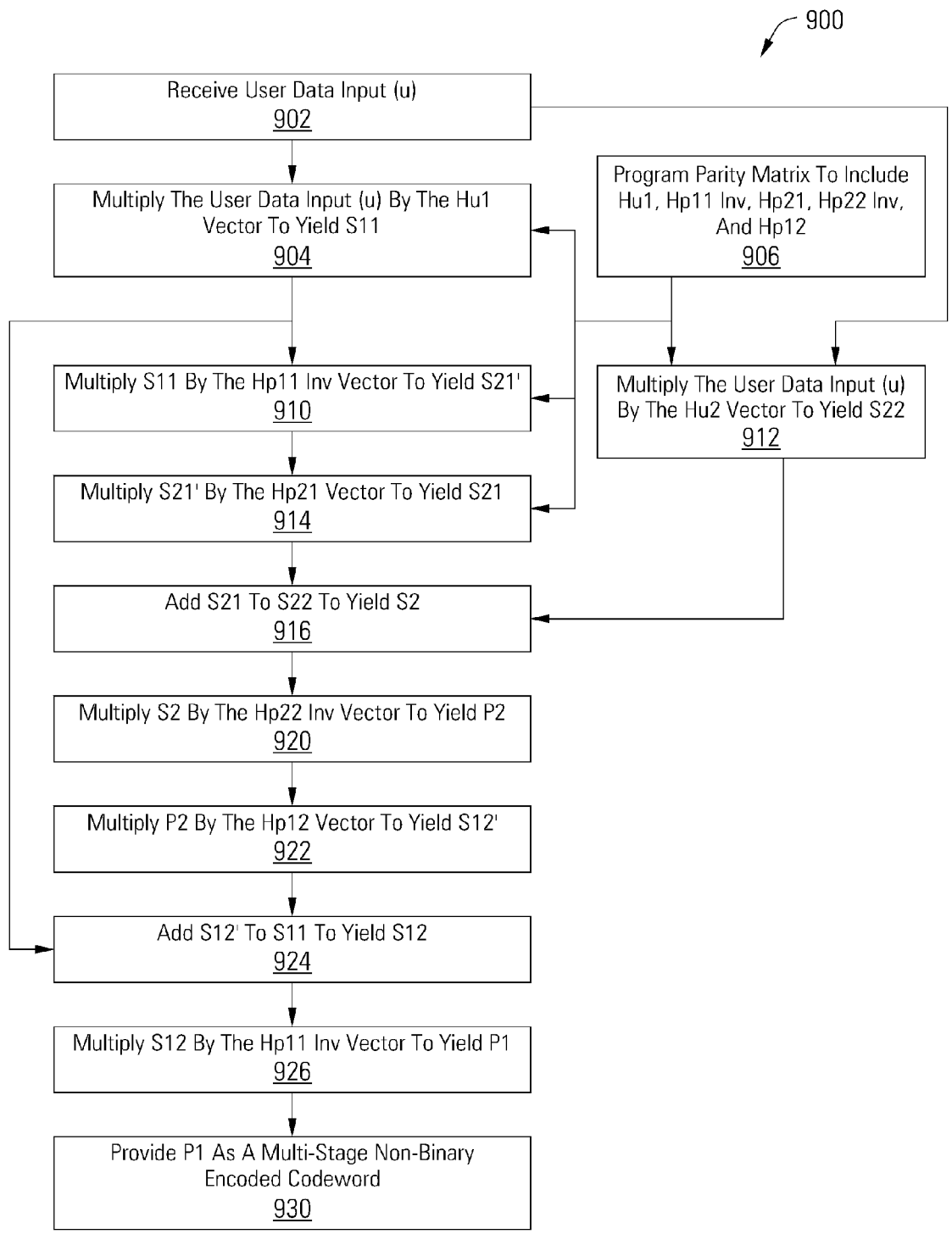
FIG. 9 is a flow diagram showing a method in accordance with some embodiments of the present invention for multi-stage encoding.

Turning to FIG. 9, a flow diagram 900 shows a method in accordance with some embodiments of the present invention for multi-stage non-binary encoding. Following flow diagram 900, a user data input (u) is received (block 902). This user data input may be received, for example, from a storage medium or a communication medium. Based upon the disclosure provided herein, one of ordinary skill in the art will recognize a variety of sources of the user data input. In addition, a parity matrix is programmed to include parity matrix portions: Hu11, Hp11 Inv, Hp21, H̃p22 Inv and Hp12 (block 906). This programming only needs to be done once, and can be used for all later uses of an encoder circuit as the parity matrix does not change In some embodiments of the present invention, Hp21, Hp11 Inv, Hu1, and Hu2 are all sparse circulant matrices. If H̃p22 is not a full rank matrix, the full rank base matrix H̃p22 which has the same rank as H̃p22 is found in accordance with the above mentioned equation. Alternatively, where H̃p22 is a full rank, the following identity is true:

$$[(\tilde{H}p22) \quad (\tilde{H}u2)] \times \begin{bmatrix} p2 \\ u \end{bmatrix} \equiv 0,$$

where:

$\tilde{H}u2 = -Hp21 \times Hp11Inv \times Hu1 + Hu2$; and $P2 = \tilde{H}p22 \times [(-Hp21 \times Hp11Inv \times Hu1 \times u) + (Hu2 \times u)]$.

The user data input (u) is multiplied by the Hu1 parity matrix portion to yield and S11 vector (block 904), and is multiplied by Hu2 to yield an S22 vector (block 912). The S11 vector and the S12 vector are respectively represented by the following equations:

$S11 = Hu1 \times u$; and $S22 = Hu2 \times u$

In turn, the S11 vector is multiplied by the Hp11 Inv parity matrix portion to yield an S21' vector (block 910) in accordance with the following equation:

$S21' = Hp11Inv \times Hu1 \times u$.

The S21' vector is multiplied by the negative of the Hp21 parity matrix portion to yield an S21 vector (block 916) in accordance with the following equation:

$S21 = -Hp21 \times Hp11Inv \times Hu1 \times u$.

The S21 vector is vector added to the S22 vector to yield an S2 vector (block 916) in accordance with the following equation.

$S2 = [(-Hp21 \times Hp11Inv \times Hu1 \times u) + (Hu2 \times u)]$.

The S2 vector is then multiplied by the H̃p22 Inv parity matrix portion to yield a vector P2 (block 920) in accordance with the following equation:

$P2 = \tilde{H}p22 \times [(-Hp21 \times Hp11Inv \times Hu1 \times u) + (Hu2 \times u)]$.

The P2 vector is then multiplied by the Hp12 vector to yield an S12' vector (block 922) in accordance with the following equation:

$S12' = Hp12 \times \tilde{H}p22 \times [(-Hp21 \times Hp11Inv \times Hu1 \times u) + (Hu2 \times u)]$.

The S12' vector is then added to the S11 vector to yield an S12 vector (block 924) in accordance with the following equation:

$S12 = Hu1 \times u + Hp12 \times \tilde{H}p22 \times [(-Hp21 \times Hp11Inv \times Hu1 \times u) + (Hu2 \times u)]$.

The S12 vector is then multiplied by the Hp11 Inv parity matrix portion to yield a vector P1 (block 925) in accordance with the following equation:

$P1 = Hp11Inv \times [Hu1 \times u + Hp12 \times \tilde{H}p22 \times [(-Hp21 \times Hp11Inv \times Hu1 \times u) + (Hu2 \times u)]]$, which is equivalent to:

$$[(\tilde{H}p22) \quad (\tilde{H}u2)] \times \begin{bmatrix} p2 \\ u \end{bmatrix} \equiv 0,$$

where:

$Hu2 = -Hp21 \times Hp11Inv \times Hu1 + Hu2$; and $P2 = \tilde{H}p22 \times [(-Hp21 \times Hp11Inv \times Hu1 \times u) + (Hu2 \times u)]$.

The resulting vector P1 is provided as a multi-stage non-binary encoded codeword (block 930). This codeword may be stored to a storage medium or transferred via a transmission medium.

Figure 10:
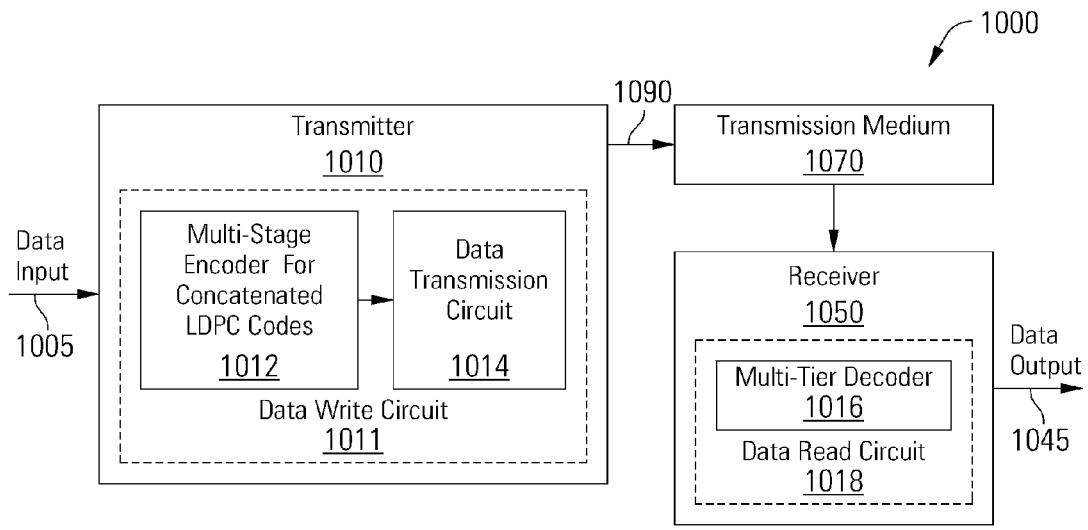
FIG. 10 shows a data transmission system including a transmitter having multi-stage encoding circuitry in accordance with some embodiments of the present invention.

Turning to FIG. 10, a data transmission system 1000 including a transmitter 1010 having multi-stage encoding circuitry for concatenated low density parity check codes is shown in accordance with some embodiments of the present invention. Transmission system 1000 may be, for example, two cellular telephones or radio sets. Based upon the disclosure provided herein, one of ordinary skill in the art will recognize a variety of transmission systems that may include the circuitry discussed in relation to FIG. 10. Transmitter 1010 includes a multi-stage encoder circuit 1012 in accordance with various embodiments of the present invention, and a data transmission circuit 1014. Multi-stage encoder circuit 1012 may be implemented similar to those described above in relation to one or more of FIGS. 1-4, and/or may operate in accordance with the flow diagram of FIG. 5. Receiver 1050 receives data received from transmitter 1010 via a transmission medium 1070. Receiver 1050 includes a data read circuit 1018 having a decoder 1016. Decoder 1016 implements a decode process that substantially reverses the encoding originally applied by multi-stage encoder circuit 1012.

In operation, a data input 1005 is provided to transmitter 1010. Multi-stage encoder circuit 1012 encodes the received data input and provides an encoded output to data transmission circuit 1014. Data transmission circuit 1014 converts the data into a radio frequency signal 1090 that is transmitted via transmission medium 1070. Receiver 1050 receives the radio frequency signal that is processed by data read circuit 1018. Such processing includes data decoding by decoder 1016. Ultimately, the decoded data is provided as a data output 1045 which corresponds to data input 1005.

Figure 11:
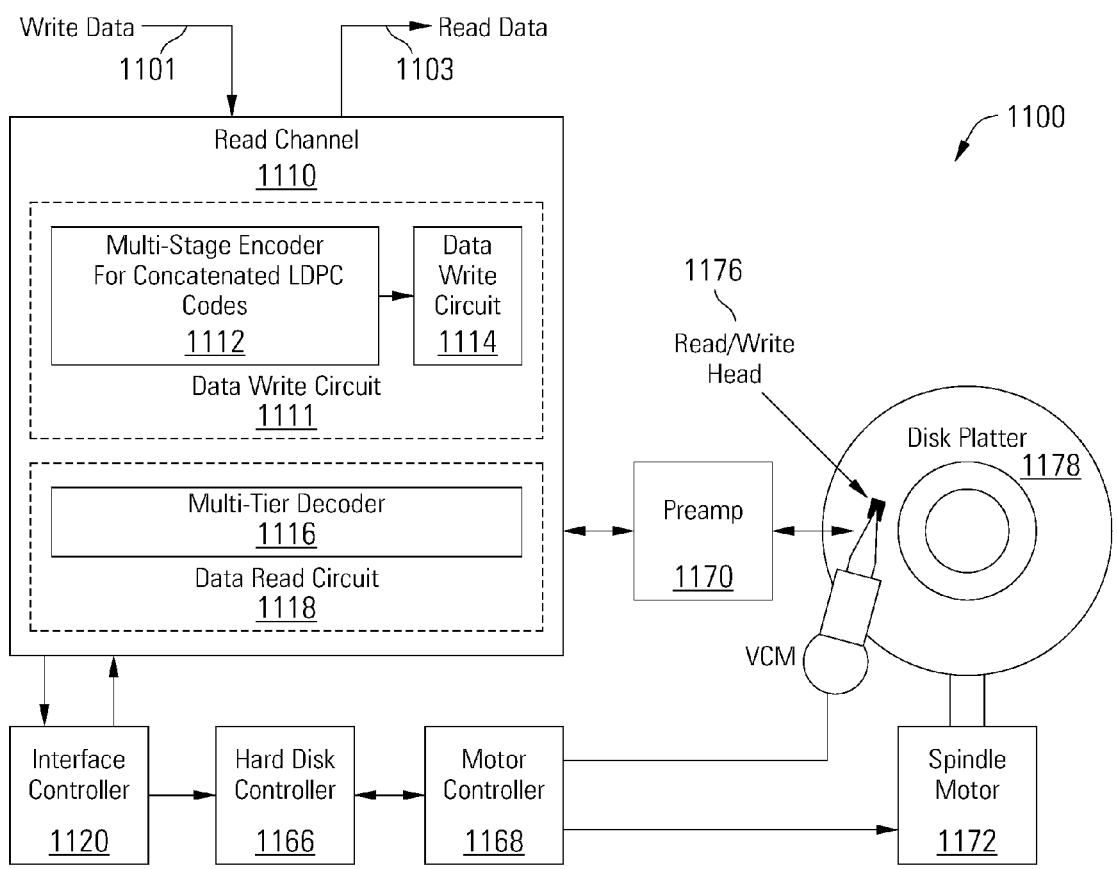
FIG. 11 depicts a data storage system having multi-stage encoding circuitry in accordance with some embodiments of the present invention.

Turning to FIG. 11, a data storage system 1100 having a read channel circuit 1110 including a multi-stage encoding circuitry for concatenated low density parity check codes is shown in accordance with some embodiments of the present invention. In particular, read channel circuit 1110 includes a data write circuit 1111 and a data read circuit 1118. Data storage system 1100 may be, for example, a hard disk drive. Based upon the disclosure provided herein, one of ordinary skill in the art will recognize a variety of storage systems that may include the circuitry discussed in relation to FIGS. 1-4. Data write circuit 1111 includes a multi-stage non-binary encoder circuit 1112 in accordance with various embodiments of the present invention, and a data write circuit 1114. Multi-stage non-binary encoder circuit 1112 may be implemented similar to those described above in relation to one or more of FIGS. 1-4, and/or may operate in accordance with the flow diagram of FIG. 5. Data read circuit 1118 receives data retrieved from a disk platter 1178 and performs a data decode process using a decoder 1116. The data decode process substantially reverses the encoding originally applied by multistage encoder circuit 1112.

In addition, data storage system 1100 includes a preamplifier 1170 that amplifies a minute electrical signal received from a read/write head assembly 1176. Read/write head assembly 1176 is disposed in relation to disk platter 1178. Data storage system 1100 also includes an interface controller 1120, a hard disk controller 1166, a motor controller 1168, and a spindle motor 1172. Interface controller 1120 controls addressing and timing of data to/from disk platter 1178. The data on disk platter 1178 consists of groups of magnetic signals that may be detected by read/write head assembly 1176 when the assembly is properly positioned over disk platter 1178. In one embodiment, disk platter 1178 includes magnetic signals recorded in accordance with a perpendicular recording scheme. In other embodiments of the present invention, disk platter 1178 includes magnetic signals recorded in accordance with a longitudinal recording scheme.

In a read operation, read/write head assembly 1176 is accurately positioned by motor controller 1168 over a desired data track on disk platter 1178. Motor controller 1168 both positions read/write head assembly 1176 in relation to disk platter 1178 and drives spindle motor 1172 by moving read/write head assembly to the proper data track on disk platter 1178 under the direction of hard disk controller 1166. Spindle motor 1172 spins disk platter 1178 at a determined spin rate (RPMs). Once read/write head assembly 1178 is positioned adjacent the proper data track, magnetic signals representing data on disk platter 1178 are sensed by read/write head assembly 1176 as disk platter 1178 is rotated by spindle motor 1172. The sensed magnetic signals are provided as a continuous, minute analog signal representative of the magnetic data on disk platter 1178. This minute analog signal is transferred from read/write head assembly 1176 to data read circuit 1118 of read channel circuit 1110 via preamplifier 1170. Preamplifier 1170 is operable to amplify the minute analog signals accessed from disk platter 1178. In turn, data read circuit 1118 decodes the received information using decoder 1116 as part of a process of digitizing the received analog signal to recreate the information originally written to disk platter 1178. This data is provided as read data 1103 to a receiving circuit.

A write operation is substantially the opposite of the preceding read operation. In particular, write data 1101 is received by data write circuit 1111 of read channel circuit 1110. Write data 1101 is encoded by encoder circuit 1112, and the encoded data is provided to a data write circuit 1114. Data write circuit 1114 drives the encoded data to preamplifier 1170. The data amplified by preamplifier 1170 are provided to read/write head assembly 1176 that generates a corresponding magnetic field that is recorded on disk platter 1178 at locations controlled by motor controller 1168.

It should be noted that storage system 1100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 1100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 1110 may be, but is not limited to, a low density parity check decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:
1. A data encoding system comprising:
a data encoder circuit operable to encode each of a plurality of data sectors with a component matrix of a low density parity check code matrix and to yield an output codeword, the data encoder circuit comprising a syndrome calculation circuit operable to calculate and combine syndromes for the plurality of data sectors.

2. The data encoding system of claim 1, wherein the plurality of data sectors comprise portions of a larger data sector that has been subdivided to for the plurality of data sectors.

3. The data encoding system of claim 1, wherein the data encoder circuit comprises a first level encoding circuit operable to apply first component matrices of the low density parity check code matrix and a second level encoding circuit operable to apply second component matrices of the low density parity check code matrix.

4. The data encoding system of claim 3, wherein the first component matrices yield syndromes that converge to a value of zero for error-free data and wherein the second component matrices yield syndromes that converge to a non-zero value for error-free data.

5. The data encoding system of claim 4, wherein the low density parity check code matrix comprises a plurality of rows and columns, with one of the first component matrices in each column and one of the second component matrices in each column.

6. The data encoding system of claim 5, wherein the low density parity check code matrix comprises one of the first component matrices in each but a remaining one of the rows, and with the second component matrices all in the remaining one of the rows.

7. The data encoding system of claim 5, wherein the first component matrices are all the same as each other, and wherein the second component matrices are all the same as each other.

8. The data encoding system of claim 5, wherein the first and second component matrices comprise quasi-cyclic low density parity check codes.

9. The data encoding system of claim 1, wherein the data encoder circuit is operable to encode all but one of the plurality of data sectors with component matrices of the low density parity check code matrix from a first group and to calculate syndromes for said all but one of the plurality of data sectors with component matrices of the low density parity check code matrix from a second group.

10. The data encoding system of claim 9, wherein the data encoder circuit is operable to encode a remaining one of the plurality of data sectors with component matrices of the low density parity check code matrix from the first group and the second group.

11. The data encoding system of claim 10, wherein the data encoder circuit is operable to encode the remaining one of the plurality of data sectors with column-wise overlapped component matrices of the low density parity check code matrix from the first group and the second group.

12. The data encoding system of claim 9, wherein the syndrome calculated by the syndrome calculation circuit in the data encoder circuit for each of the plurality of data sectors converges to a non-zero value with error-free data, and wherein a syndrome for the output codeword converges to zero with error-free data.

13. The data encoding system of claim 12, wherein the syndrome calculation circuit is operable to combine the syndromes for the plurality of data sectors using XOR operations.

14. The data encoding system of claim 1, wherein the data encoder circuit is implemented as an integrated circuit.

15. The data encoding system of claim 1, wherein the data encoder circuit is implemented as part of a device selected from a group consisting of: a data storage device and a wireless communication device.

16. A method for encoding data sectors with concatenated low density parity check codes, comprising:
  receiving a plurality of data sectors in a data encoder circuit;
  encoding all but one of the plurality of data sectors in the data encoder circuit using a component matrix of a low density parity check code matrix from a first group;
  calculating a syndrome for each of said all but one of the plurality of data sectors using a component matrix of the low density parity check code matrix from a second group;
  combining the syndromes; and
  encoding said one of the plurality of data sectors in the data encoder circuit using a component matrix of a low density parity check code matrix from the first group and a component matrix of the low density parity check code matrix from the second group.

17. The method of claim 16, wherein the syndromes converge to non-zero values for error-free data, and wherein an overall syndrome for the plurality of data sectors encoded with the low density parity check code matrix converges to zero for error-free data.

18. The method of claim 16, wherein the syndromes are combined with an XOR operation.

19. The method of claim 16, further comprising dividing an input data sector to form the plurality of data sectors, wherein the input data sector is larger than each of the plurality of data sectors.

20. A storage device, comprising:
  a storage medium;
  a head assembly disposed in relation to the storage medium and operable to provide a sensed signal corresponding to a data set on the storage medium; and
  a read channel circuit including a data encoder circuit operable to encode all but one of a plurality of data sectors using a component matrix of a low density parity check code matrix from a first group, calculate a syndrome for each of said all but one of the plurality of data sectors using a component matrix of the low density parity check code matrix from a second group, combine the syndromes, and encode said one of the plurality of data sectors using a component matrix of the low density parity check code matrix from the first group and a component matrix of the low density parity check code matrix from the second group.

* * * * *